United States Patent [19]

Komatsu

[11] Patent Number: 5,414,467
[45] Date of Patent: May 9, 1995

[54] CHARGE TRANSFER DEVICE WHEREIN THE TIME CONSTANT BETWEEN THE CLOCK MEANS AND THE TRANSFER GATE ELECTRODES ARE SUBSTANTIALLY EQUAL

[75] Inventor: Eiji Komatsu, Kanagawa, Japan

[73] Assignee: Sony Corporation, Tokyo, Japan

[21] Appl. No.: 291,493

[22] Filed: Aug. 17, 1994

Related U.S. Application Data

[63] Continuation of Ser. No. 44,503, Apr. 9, 1993, abandoned.

Foreign Application Priority Data

Apr. 13, 1992 [JP] Japan .................................. 4-093027

[51] Int. Cl.$^6$ ............................................. H04N 5/335
[52] U.S. Cl. ...................................... 348/322; 348/316;
348/320; 257/245; 257/340
[58] Field of Search ............... 348/230, 311, 312, 316,
348/322, 324; H04N 5/335; 257/245, 246, 340,
386

[56] References Cited

U.S. PATENT DOCUMENTS

| | | | |
|---|---|---|---|
| 4,279,000 | 7/1981 | Fukuda et al. | 358/213 |
| 4,590,506 | 5/1986 | Esser | 357/24 |
| 4,617,471 | 10/1986 | Suzuki et al. | 250/578 |
| 4,935,793 | 6/1990 | Boutigny | 357/24 |
| 5,019,884 | 5/1991 | Yamawaki | 357/24 |

*Primary Examiner*—Michael T. Razavi
*Assistant Examiner*—Ngoc-Yen Vu
*Attorney, Agent, or Firm*—Hill, Steadman & Simpson

[57] ABSTRACT

The present invention is directed to a charge transfer device formed on a semiconductor substrate which comprises a channel region formed on the semiconductor substrate, at least a set of transfer gate electrodes formed adjacent to each other and insulated from each other, the set of transfer gate electrode formed over the channel region through an insulating film, clock means for providing the transfer gate electrode with multiple clock pulses, and a plurality of resistors provided between each of the transfer gate electrodes and the clock means, the resistors having respective values corresponding to capacitances of the transfer gate electrodes. Therefore, a transfer efficiency of signal charges can be improved without reducing a maximum amount of signal charges handled by a vertical register.

6 Claims, 7 Drawing Sheets

CHARGE TRANSFER DEVICE WHEREIN THE TIME CONSTANT BETWEEN THE CLOCK MEANS AND THE TRANSFER GATE ELECTRODES ARE SUBSTANTIALLY EQUAL

This is a continuation of application Ser. No. 08/044,503, filed Apr. 9, 1993, now abandoned.

BACKGROUND OF THE INVENTION

1. Field of the Invention

The present invention relates to charge transfer devices and, more particularly, is directed to a charge transfer device for use in a CCD (charge-coupled device) image sensor, a CCD linear sensor or the like.

2. Description of the Prior Art

As a charge transfer device in which a charge transfer portion is formed of a CCD, there are known a CCD image sensor, a CCD linear sensor, a CCD delay line or the like.

A CCD image sensor of an interline type comprises, as shown in FIG. 1 of the accompanying drawings, light sensing sections 21, each of which is formed of a photodiode, arrayed in the horizontal and vertical directions in a matrix fashion, a vertical register 22 commonly provided in association with the light sensing sections 21 on the common vertical line, and a horizontal register 23 commonly provided for the respective vertical registers 22.

A signal charge accumulated in the light sensing section 21 during a charge storage period is read out to the vertical register 22. Then, during the horizontal blanking period, a signal charge is transferred at every row and a signal charge accumulated in the final stage of the vertical register 22 is transferred to the horizontal register 23. In the next horizontal output period (corresponding to one horizontal scanning period of television signal), a signal charge on the horizontal register 23 is transferred to an output section 24 side and is thereby output from the output section 24 as an imager signal S.

In particular, the vertical register 22 includes transfer stages, one set of which is formed of, for example, four transfer gate electrodes, arrayed in the vertical direction. Drive pulses having different phases are applied to the respective transfer gate electrodes, whereby the signal charge read out to the vertical register 22 from the light sensing section 21 is transferred to the horizontal register 23 side.

Although respective transfer gate electrodes are formed on the vertical register 22 by utilizing a conductor forming region provided between the light sensing sections 21, the four transfer gate electrodes cannot be formed of exactly the same pattern. As a result, from a conductor forming standpoint, a contact area of each transfer electrode on the vertical register 22 is fluctuated unavoidably.

As shown in FIG. 2, when transfer gate electrodes G1 and G3 to which drive pulses V1, V3 are applied are formed to be wider than transfer gate electrodes G2 and G4 to which drive pulses V2, V4 are applied so as to have a large contact area with the vertical register 22, added capacitances of the transfer gate electrodes G1, G3 become larger than those of the transfer gate electrodes G2, G4 so that waveforms of the drive pulses V1, V3 are blunted as compared with those of the drive pulses V2, V4.

Accordingly, as shown in FIG. 3, before the drive pulse V1 that is applied to the transfer gate electrode G1 goes to low (L) level fully, the drive pulse V4 that is applied to the adjacent transfer gate electrode G4 goes to high (H) level at timing point $t_1$. At the next timing point $t_2$, before the drive pulse V2 that is applied to the transfer gate electrode G2 goes to low level fully, the drive pulse V1 that is applied to the adjacent transfer gate electrode G1 goes to high level. Consequently, a maximum amount of electric charges handled by the vertical register 22 is decreased. There is then the disadvantage that characteristics of the CCD image sensor are deteriorated.

OBJECTS AND SUMMARY OF THE INVENTION

Therefore, it is an object of the present invention to provide an improved charge transfer device in which the aforesaid shortcomings and disadvantages encountered with the prior art can be eliminated.

More specifically, it is an object of the present invention to provide a charge transfer device in which a transfer efficiency of signal charge can be improved without reducing a maximum amount of electric charges handled by a charge transfer region.

According to a first aspect of the present invention, there is provided a charge transfer device formed on a semiconductor substrate which comprises a channel region formed on the semiconductor substrate, at least a set of transfer gate electrodes formed adjacent to each other and insulated from each other, the set of transfer gate electrode formed over the channel region through an insulating film, clock means for providing the transfer gate electrode with multiple clock pulses, and a plurality of resistors provided between each of the transfer gate electrodes and the clock means, the resistors having respective values corresponding to capacitances of the transfer gate electrodes.

According to a second aspect of the present invention, there is provided a solid state image sensing device formed on a semiconductor substrate which comprises a plurality of photo-sensing elements formed in a surface of the semiconductor substrate, a channel region formed on the semiconductor substrate, the channel region formed adjacent to the plurality of photo-sensing elements, at least a set of transfer gate electrodes which are insulated from each other and formed over the channel region through an insulating film, clock means for providing the transfer gate electrodes with multiple clock pulses, and a plurality of resistors provided between each of the transfer gate electrodes and the clock means, the resistors having respective values corresponding to capacitances of the transfer gate electrodes.

As a third aspect of the present invention, there is provided a charge transfer device formed on a semiconductor substrate which comprises a channel region formed in a surface of the semiconductor substrate, a plurality of sets of transfer gate electrodes which are insulated from each other and formed over the channel region through an insulating film, clock means for providing the transfer gate electrodes with multiple clock pulses, and resistance means provided between the transfer gate electrodes and the clock means, the resistance means having respective values corresponding to capacitances of the transfer gate electrodes so that time constants of the transfer gate electrodes are substantially the same.

The above and other objects, features, and advantages of the present invention will become apparent from the following detailed description of an illustrative embodiment thereof to be read in conjunction with the accompanying drawings, in which like reference numerals are used to identify the same or similar parts in the several views.

DETAILED DESCRIPTION OF THE PREFERRED EMBODIMENT

A charge transfer device according to an embodiment of the present invention will hereinafter be described with reference to FIGS. 4 to 11.

Figure 1:
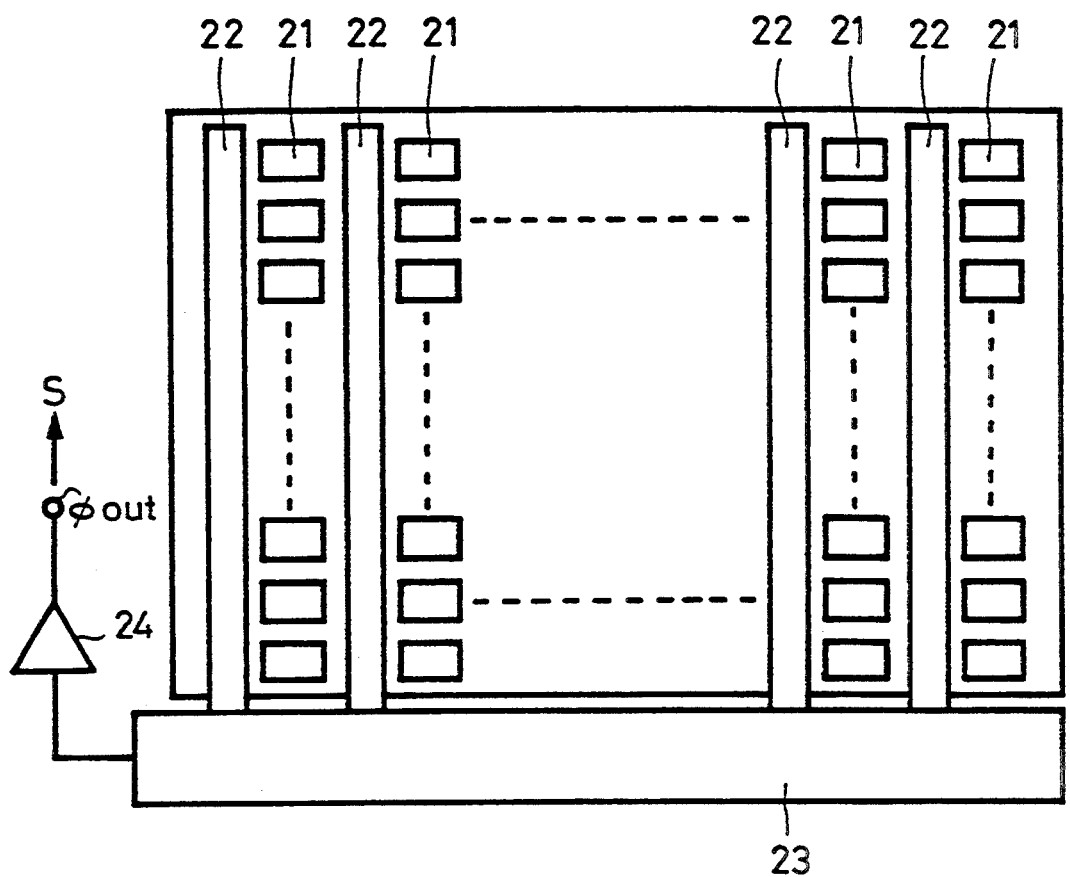
FIG. 1 is a schematic plan view generally showing a structure of a CCD image sensor.
Figure 2:
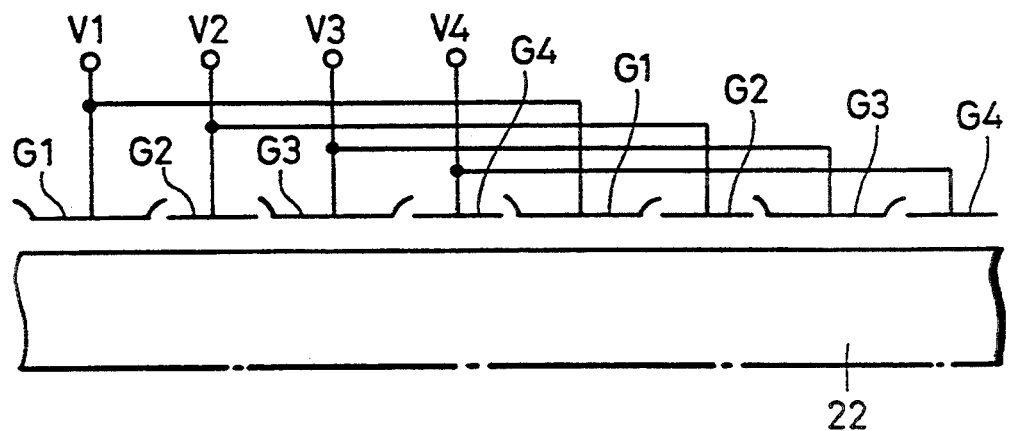
FIG. 2 is a diagram showing a structure of a vertical transfer section of a conventional CCD image sensor.
Figure 3:
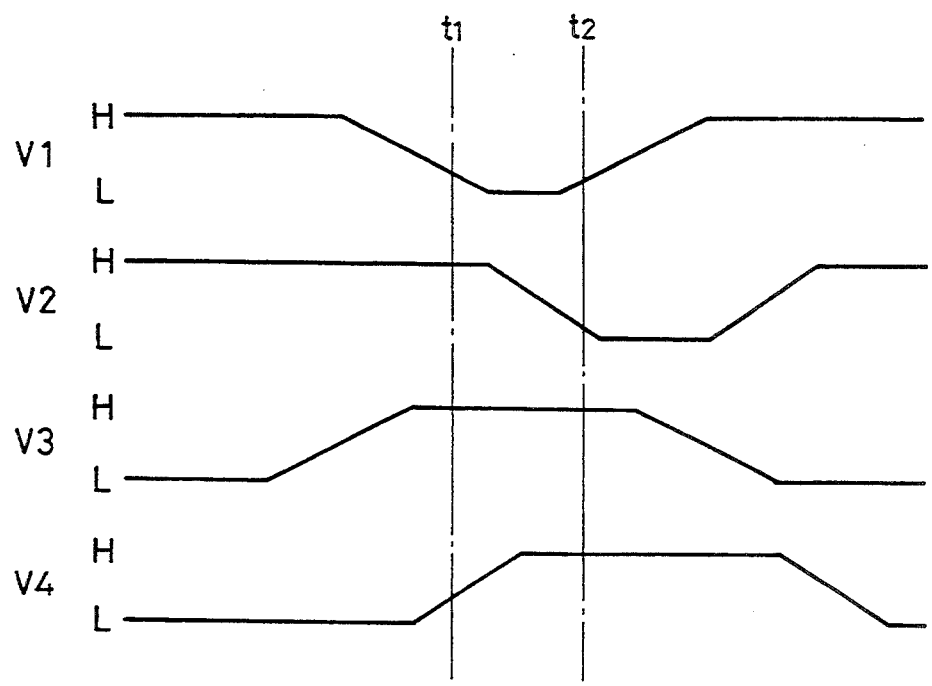
FIG. 3 is a diagram of waveforms of drive pulses, and to which references will be made in explaining disadvantages of the conventional CCD image sensor.
Figure 4:
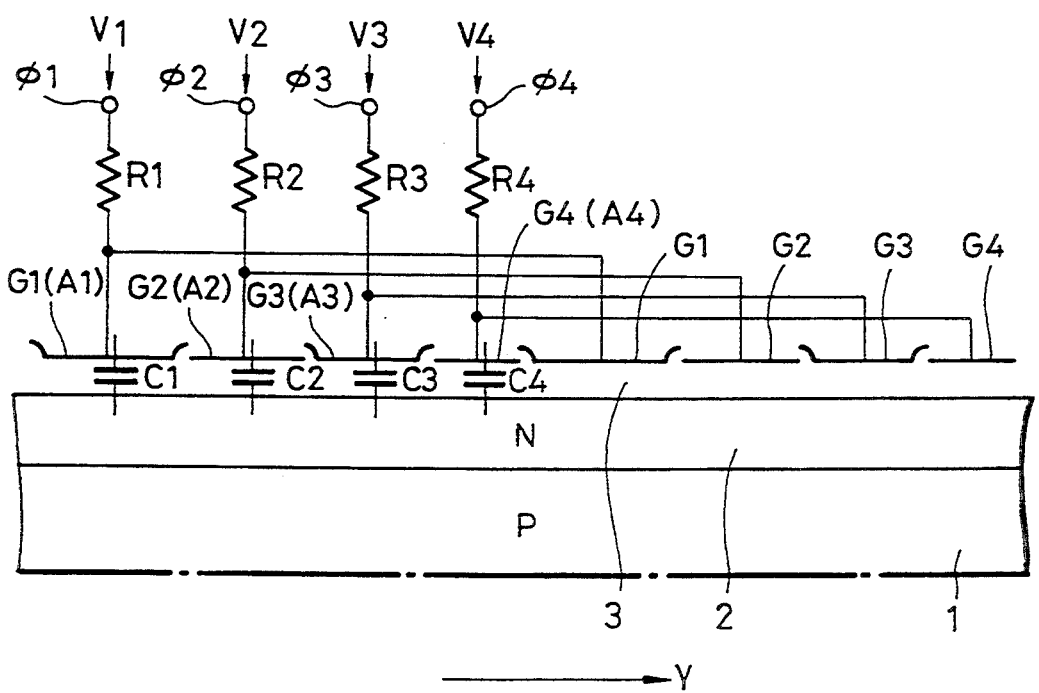
FIG. 4 is a diagram showing a structure of a CCD image sensor according to an embodiment of the present invention, in particular, a structure of a vertical transfer section from a principle standpoint.

FIG. 4 is a diagram showing a structure of a CCD image sensor according to the embodiment of the present invention, in particular, a vertical transfer section thereof from a principle standpoint.

A structure of the vertical transfer section according to this embodiment will be described below with reference to FIG. 4. As shown in FIG. 4, a vertical register 2 of N-type impurity diffusion region band is formed on a silicon substrate 1 of, for example, P-type. Transfer stages one set of which is formed of four transfer gate electrodes G1, G2, G3 and G4 are arrayed on the vertical register 2 through an insulating film 3 in the vertical direction (Y direction).

Contact areas provided between each of the transfer gate electrodes G1, G2, G3 and G4 and the vertical register 2 are fluctuated depending upon the patterns with which the transfer gate electrodes G1, G2, G3, G4 are formed. In the illustrated example of FIG. 4, assuming that A1, A2, A3 and A4 represent contact areas provided between the respective transfer gate electrodes G1, G2, G3, G4 and the vertical register 22, then an inequality of $A1>A2>A3>A4$ is satisfied. Therefore, capacitances C1, C2, C3 and C4 added to the respective transfer gate electrodes G1, G2, G3, G4 are set in a relation expressed as $C1>C2>C3>C4$.

In this embodiment, resistors R1, R2, R3 and R4 having different resistance values are coupled to the respective transfer gate electrodes G1, G2, G3 and G4. Resistance values of the respective resistors R1, R2, R3 and R4 are set in a relation expressed as $R1<R2<R3<R4$. Resistance values of these resistors R1, R2, R3 and R4 are set such that time constants $C1 \cdot R1$, $C2 \cdot R2$, $C3 \cdot R3$ and $C4 \cdot R4$ of the respective transfer gate electrodes G1, G2, G3 and G4 become substantially the same.

Figure 5A:
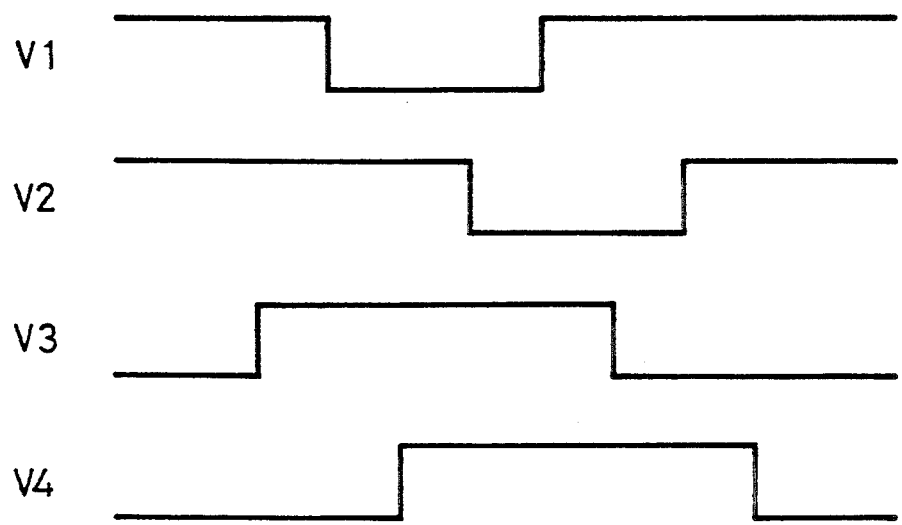
FIG. 5A is a diagram of waveforms of drive pulses (square pulses) supplied to an input terminal of the CCD image sensor according to the embodiment of the present invention.
Figure 5B:
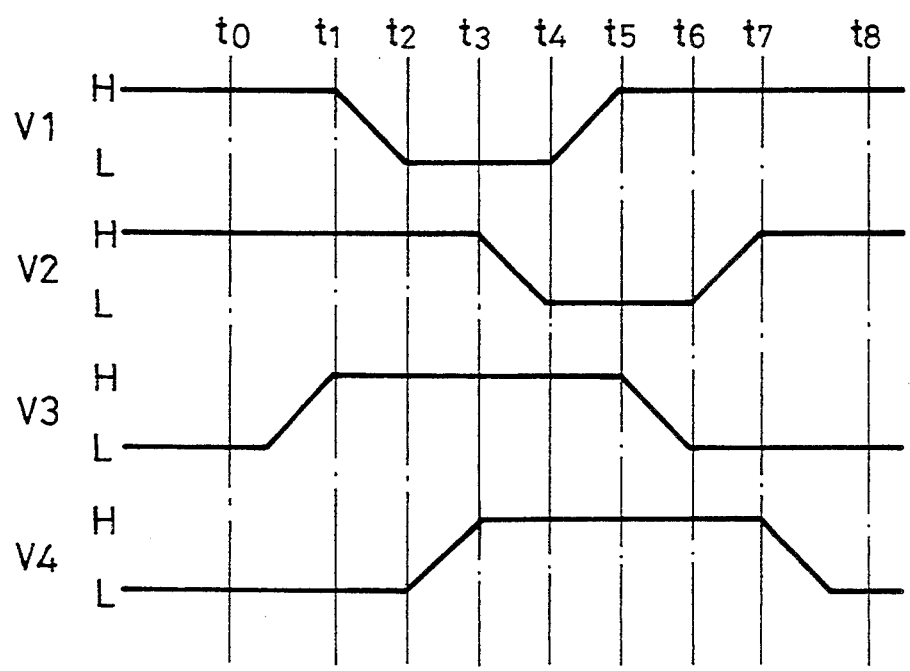
FIG. 5B is a diagram of waveforms of drive pulses used in actual practice.

Consequently, when square drive pulses V1, V2, V3 and V4 whose phases are different as shown in FIG. 5A are respectively applied to input terminals $\phi 1$, $\phi 2$, $\phi 3$ and $\phi 4$ of the respective transfer gate electrodes G1, G2, G3 and G4, the waveforms of the drive pulses V1, V2, V3 and V4 are blunted with substantially the same ratio due to the aforesaid time constants $C1 \cdot R1$, $C2 \cdot R2$, $C3 \cdot R3$ and $C4 \cdot R4$. Thus, the waveforms of the drive pulses V1, V2, V3 and V4 are presented as shown in FIG. 5B. Generally, a transfer efficiency of signal charges depends upon a period in which the drive pulses V1, V2, V3 and V4 are switched from high to low level, and the longer the duration of such switching period becomes the better the transfer efficiency becomes.

Therefore, according to this embodiment, the respective drive pulses V1, V2, V3 and V4 are blunted in waveform by the added capacitances C1, C2, C3, C4 and the added resistors R1, R2, R3, R4 and the period in which the drive pulses V1, V2, V3 and V4 are switched from high (H) to low (L) level is extended in duration as compared with the case that the drive pulses V1, V2, V3, V4 have the square pulse waveforms, thereby improving a transfer efficiency of signal charges.

Since drive pulses V1, V2, V3 and V4 are blunted with substantially the same ratio as described above, a probability of phenomenon that at timing point $t_2$ shown in FIG. 5B the transfer pulse V4 goes to high level before the drive pulse V1 is fully lowered can be decreased. In addition, since the output timings of the respective drive pulses V1, V2, V3 and V4 can be predicted with ease, the optimum periods from the leading edges to the trailing edges of the respective drive pulses V1, V2, V3 and V4 can be set with ease. Hence, it becomes possible to eliminate the aforesaid phenomenon completely.

Operation that signal charges are transferred by the application of the respective drive pulses V1, V2, V3 and V4 shown in FIG. 5B will be described below with reference to also FIG. 6.

Figure 6:
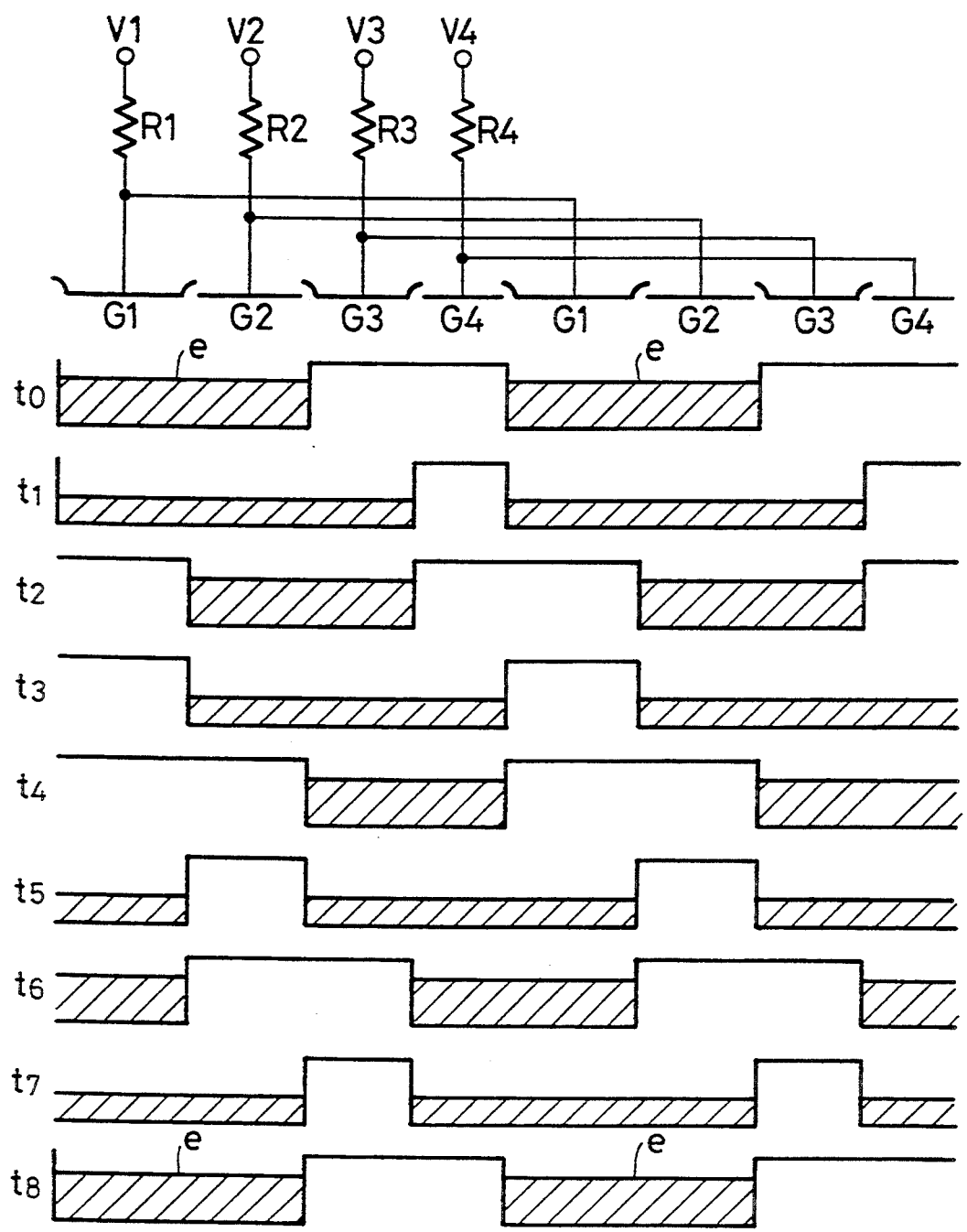
FIG. 6 is a conceptual diagram showing transfer operation of a signal charge according to the embodiment of the present invention.

As shown in FIG. 6, since the drive pulses V1 and V2 are held at high level at timing point $t_0$ as shown in FIG. 5B, a continuous potential well is formed beneath the transfer gate electrodes G1, G2 and a signal charge e is transferred to and accumulated in the above potential well.

The drive pulse V3 goes to high level at the next timing point $t_1$ as shown in FIG. 5B so that a potential formed beneath the transfer gate electrode G3 is increased to form a continuous potential well under the transfer gate electrodes G1, G2, G3. The signal charge e is transferred to and accumulated in this potential well. The switching period in which the drive pulse V3 is switched from low to high level is extended in duration from timing point $t_0$ to timing point $t_1$ by the time constant of the transfer gate electrode G3 so that the signal charge e can be efficiently transferred from the transfer gate electrodes G1, G2 to the under side of the transfer gate electrode G3.

At the next timing point $t_2$, the drive pulse V1 goes to low level so that the potential formed under the transfer gate electrode G1 is decreased. Thus, the signal charge e is transferred to and accumulated in the potential well continuously formed beneath the transfer gate electrodes G2 and G3. At that time, since the switching period in which the drive pulse V1 is switched from high to low level is extended in duration from timing point $t_1$ to timing point $t_2$ by the time constant of the transfer gate electrode G1, the signal charge e provided under the transfer gate electrode G1 can be efficiently transferred to the potential well continuously formed under the transfer gate electrodes G2 and G3.

Since the drive pulse V4 goes to high level at the next timing point $t_3$, the potential provided under the transfer electrode G4 is increased and the potential well is continuously formed under the transfer gate electrodes G2, G3 and G4. The signal charge e is transferred to and accumulated in this potential well. Since the switching period in which the drive pulse V4 is switched from low to high level is extended in duration from timing point $t_2$ to timing point $t_4$ by the time constant of the transfer gate electrode G4. Thus, the signal charge e can be efficiently transferred from the transfer gate electrodes G2 and G3 to the underside of the transfer gate electrode G4.

Since the drive pulse V2 goes to low level at the next timing point $t_4$, the potential provided under the transfer gate electrode G2 is decreased and the signal charge e is transferred to and accumulated in a potential well continuously formed below the transfer gate electrodes G3 and G4. At that time, since the switching period in which the drive pulse V2 is switched from high to low level is extended from timing point $t_3$ to $t_4$ by the time constant of the transfer gate electrode G2, the signal charge e provided under the transfer gate electrode G2 can be efficiently transferred to the potential well continuously formed below the transfer gate electrodes G3 and G4.

Since the drive pulse V1 goes to high level at the next timing point $t_5$, the potential provided under the transfer gate electrode G1 is increased and a potential well is continuously formed under the transfer gate electrodes G3, G4 and G1. The signal charge e is transferred to and accumulated in this potential well. Since the switching period in which the drive pulse V1 is switched from low to high level is extended in duration from timing point $t_4$ to timing point $t_5$ by the time constant of the transfer gate electrode G1, the signal charge e is efficiently transferred from the transfer gate electrodes G3 and G4 to the underside of the transfer gate electrode G1.

Since the drive pulse V3 goes to low level at the next timing point $t_6$, the potential formed under the transfer gate electrode G3 is decreased and the signal charge e is transferred to and accumulated in the potential well continuously formed under the transfer gate electrodes G4 and G1. At that time, since the switching period in which the drive pulse V3 is switched from high to low level is extended in duration from timing point $t_5$ to timing point $t_6$ by the time constant of the transfer gate electrode G3, the signal charge e formed under the transfer gate electrode G3 is efficiently transferred to the potential well continuously formed under the transfer gate electrodes G4 and G1.

Since the drive pulse V2 goes to high level at the next timing point $t_7$, the potential formed under the transfer gate electrode G2 is increased and a potential well is continuously formed under the transfer gate electrodes G4, G1 and G2. The signal charge e is transferred to and accumulated in this potential well. Since the switching period in which the drive pulse V2 is switched from low to high level is extended in duration from timing point $t_6$ to $t_7$ by the time constant of the transfer gate electrode G2, the signal charge e is efficiently transferred from the transfer gate electrodes G4 and G1 to the underside of the transfer gate electrode G2.

Since the drive pulse V4 goes to low level at the next timing point $t_8$, the potential formed under the transfer gate electrode G4 is decreased and the signal charge e is transferred to and accumulated in a potential well continuously formed under the transfer gate electrodes G1 and G2. At that time, the switching period in which the drive pulse V4 is switched from high to low level is extended in duration from timing point $t_7$ to $t_8$, the signal charge e formed under the transfer gate electrode G4 is efficiently transferred to a potential well continuously formed under the transfer gate electrodes G1 and G2.

According to a series of aforesaid operation, the signal charge e on one transfer stage is transferred to the adjacent transfer stage. Then, the signal charge e on the vertical register 2 is sequentially transferred to a horizontal register (not shown) side by repeating a series of aforesaid operation.

The case that the above-mentioned structure is applied to the CCD image sensor in actual practice will be described with reference to FIGS. 7 to 11.

Figure 7:
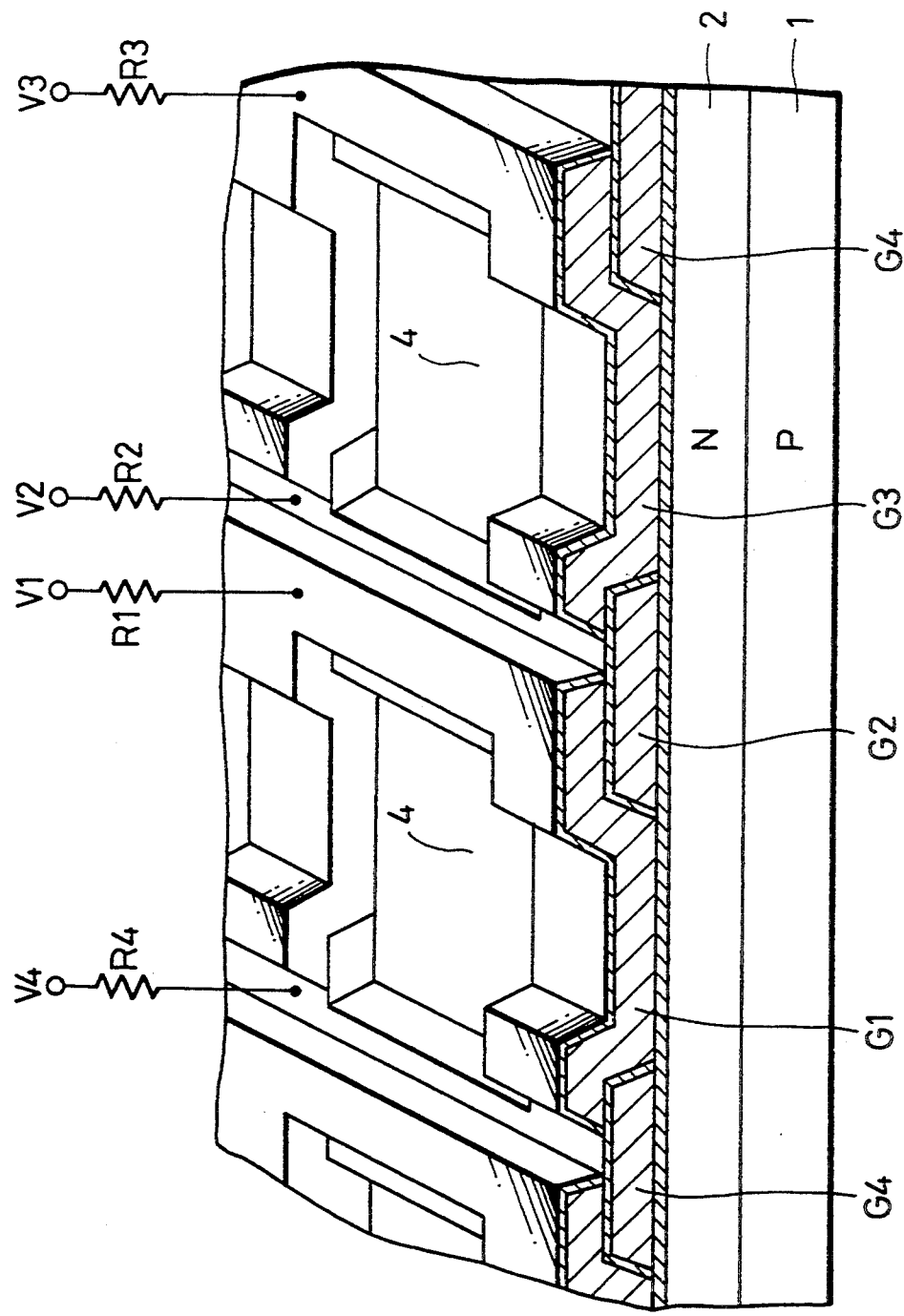
FIG. 7 is a perspective view showing in a fragmentarily exploded fashion an example that transfer gate electrodes according to the embodiment of the present invention are formed in actual practice.

FIG. 7 is a perspective view showing the image sensor according to the embodiment of the present invention, in particular, the vertical transfer section in a fragmentarily exploded fashion. In FIG. 7, reference numeral 4 depicts a light sensing section. In FIG. 7, like parts corresponding to those of FIG. 4 are marked with the same references.

In the vertical transfer section of the CCD image sensor, as shown in FIG. 7, the first transfer gate electrode G1 to which the drive pulse V1 is applied and the third transfer gate electrode G3 to which the drive pulse V3 is applied are formed with the same pattern. The second transfer gate electrode G2 to which the drive pulse V2 is applied and the fourth transfer gate electrode G4 to which the drive pulse V4 is applied are formed with the same pattern. The conductor widths of the first and third transfer gate electrodes G1, G3 are narrower than those of the second and fourth transfer gate electrodes G2, G4. The areas in which the first and third transfer gate electrodes G1, G3 are brought in contact with the vertical register 2 are wider than those of the second and fourth transfer gate electrodes G2, G4. Thus, the first and third transfer gate electrodes G1, G3 have time constants, determined by the conductor resistance and the added capacitance of the vertical register 2, larger than those of the second and fourth transfer gate electrodes G2, G4.

Therefore, according to this embodiment, resistance values of the resistors R1, R3 coupled to the first and third transfer gate electrodes G1, G3 are selected to be the same (R1=R3), and the resistance values of the resistors R2 and R4 coupled to the second and fourth transfer gate electrodes G2, G4 are selected to be the same (R2=R4). Further, the resistance values of the resistors R1, R3 are selected to be smaller than those of the resistors R2, R4 (R1, R3<R2, R4).

Figure 8:
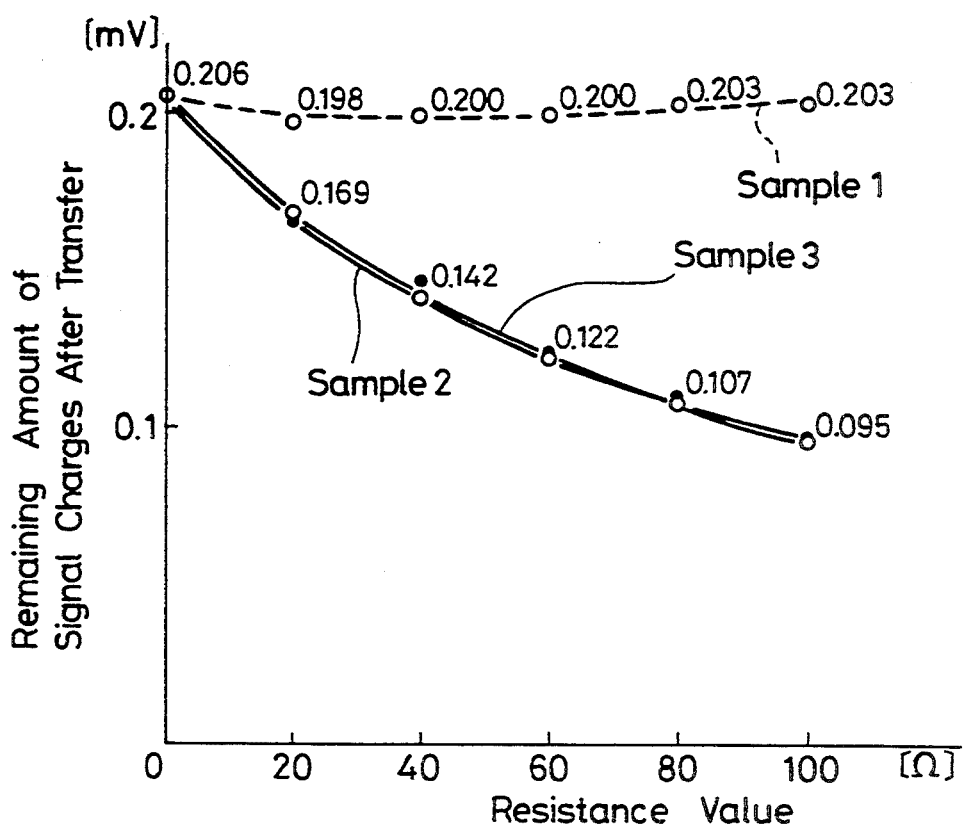
FIG. 8 is a characteristic graph showing the change of a transfer remaining amount relative to resistance values of respective samples.

The measured results of experimental example will be described below. In the structure shown in FIG. 7, a sample 1 represents the case that resistors of the same value are connected only to the first and third transfer gate electrodes G1, G3. A sample 2 represents the case that resistors of the same value are connected to the respective transfer gate electrodes G1, G2, G3 and G4. A sample 3 represents the case that resistors of the same value are connected only to the second and fourth transfer gate electrodes G2, G4. Then, amounts that the signal charges are not fully transferred in the samples 1, 2 and 3 were measured. As shown in FIG. 8, the sample 1 has much amount that the signal charges are not fully transferred regardless of the values of the resistors to be connected. Therefore, the structure represented by the sample 1 cannot be utilized.

Figure 9:
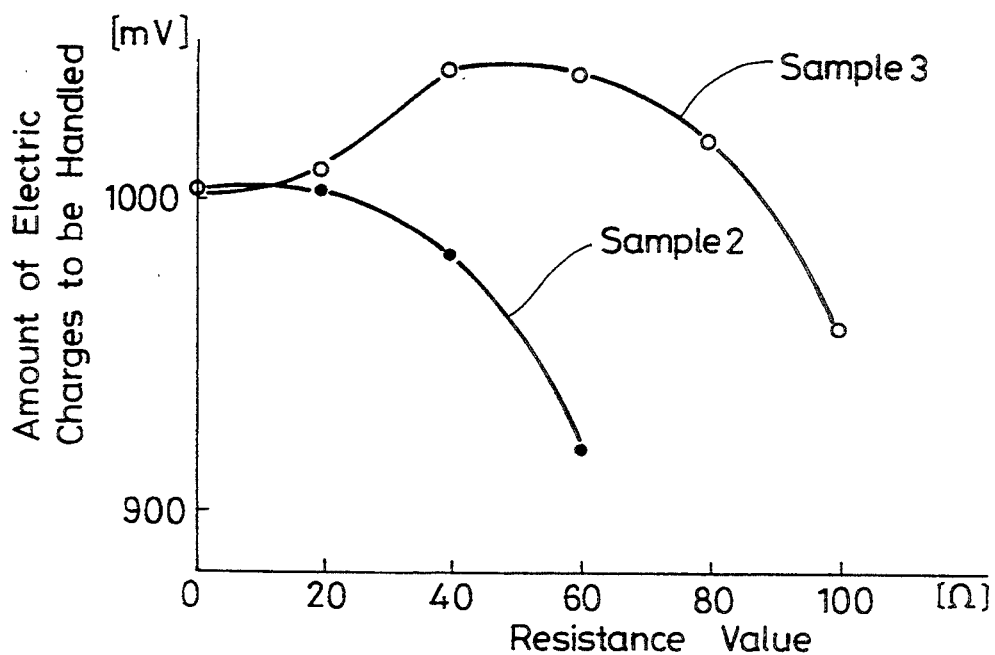
FIG. 9 is a characteristic graph showing the change of an amount of electric charges to be handled relative to resistance values of samples 1 and 2.

On the other hand, with respect to the samples 2 and 3, as the values of the resistors to be connected were increased, the remaining amounts of signal charges were decreased and the transfer efficiency could be improved. When the change of the amount of signal charges to be handled was examined, as shown in FIG. 9, the amount of signal charge to be handled was decreased from a resistance value of about 20 Ω in the sample 2. In the sample 3, the amount of signal charges to be handled tends to decrease from about 60 Ω and is decreased to become smaller than a reference amount of signal charges to be handled from about 90 Ω.

Study of experimental results reveals that, if resistors having large resistance values are coupled to the second and fourth transfer gate electrodes G2, G4 having the small added capacitances and resistors having small resistance values are coupled to the first and third transfer gate electrodes G1, G3 having the large added capacitances, then the transfer efficiency can be improved considerably without sacrificing the amount of signal charges to be handled.

In the embodiment shown in FIG. 7, the resistors R1 and R3 having the resistance value of 20 Ω are coupled to the first and third transfer gate electrodes G1, G3 and the resistors R2 and R4 having the resistance value of 60 Ω are coupled to the second and fourth transfer gate electrodes G2, G4.

Figure 10:
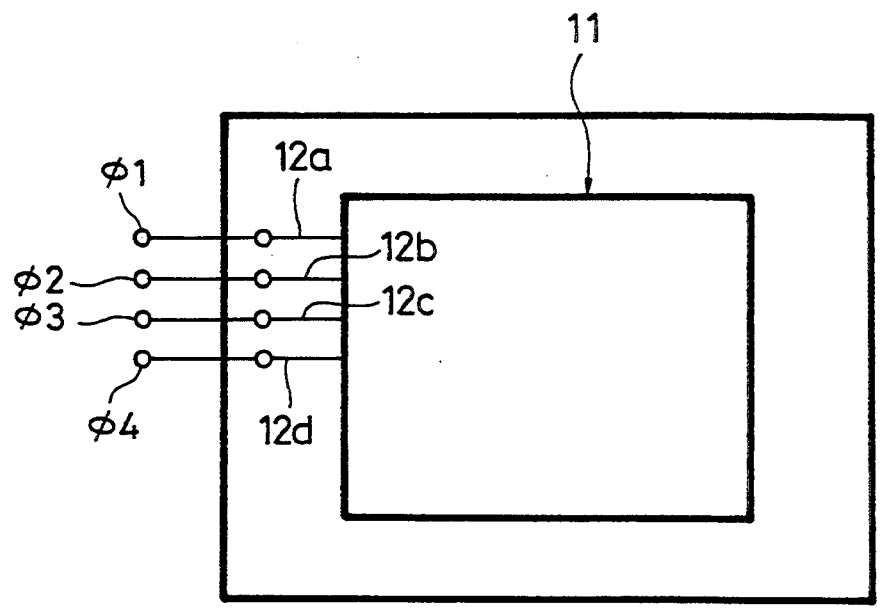
FIG. 10 is a plan view schematically showing a structure of a peripheral portion of an image sensor according to the embodiment of the present invention.

It is preferred that the resistors R1, R2, R3 and R4 are connected to the transfer gate electrodes G1, G2, G3 and G4 in the conductor forming region in a peripheral portion of an image area when the charge transfer device of the present invention is applied to the CCD image sensor, for example. As shown in FIG. 10, respective transfer gate electrodes on the vertical register within the image area 11 in which light sensing sections are arrayed in a matrix fashion are electrically connected to corresponding input terminals $\phi 1$, $\phi 2$, $\phi 3$ and $\phi 4$ through conductors 12a, 12b, 12c and 12d in the conductor forming region in the peripheral portion of the image area 11. The above-mentioned conductors 12a, 12b, 12c and 12d are constructed as follows.

The conductor (generally formed of polycrystalline silicon layers) 12a, 12b, 12c and 12d extended from the respective transfer gate electrodes G1, G2, G3 and G4 are electrically connected to the inner sides of the input terminals $\phi 1$, $\phi 2$, $\phi 3$ and $\phi 4$ through resistance lines 13a, 13b, 13c and 13d, each having the same width and length.

Figure 11:
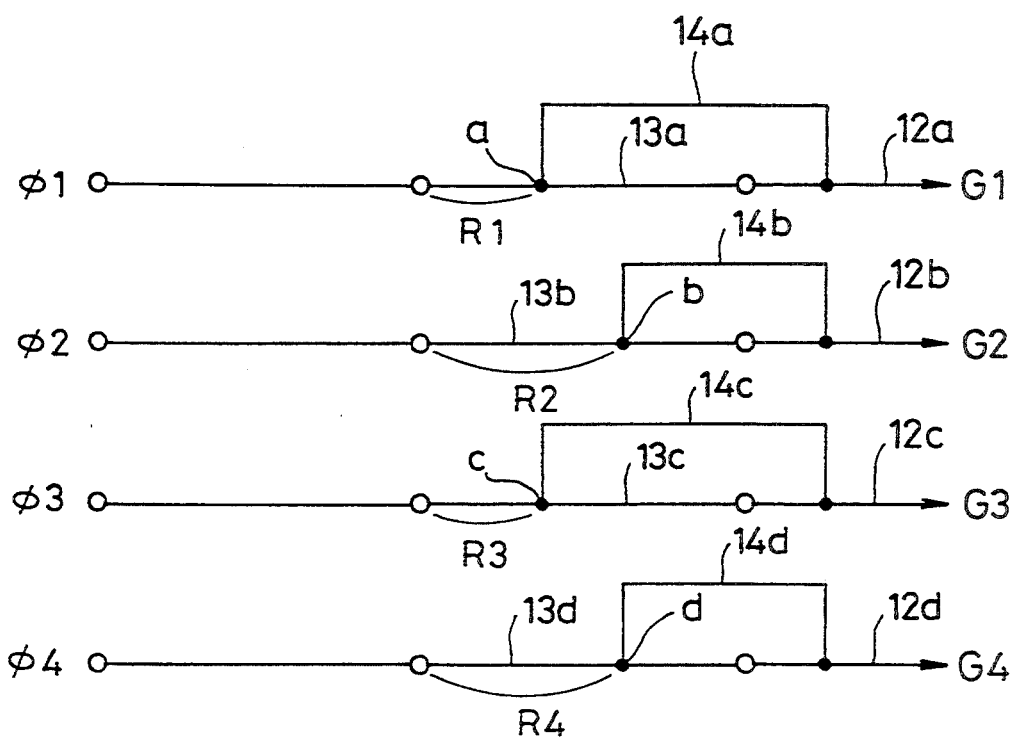
FIG. 11 is a diagram used to explain a method of connecting (forming) resistors according to the embodiment of the present invention.

Then, as shown in FIG. 11, the conductor layers 12a, 12b, 12c and 12d and the resistance lines 13a, 13b, 13c and 13d are coupled to one another by means of Al conductors 14a, 14b, 14c and 14d. At that time, if connected positions a, b, c and d between the Al conductors 14a, 14b, 14c and 14d and the resistance lines 13a, 13b, 13c and 13d are properly selected in response to the added capacitances of the respective transfer gate electrodes G1, G2, G3 and G4, this will become equivalent to the structure that the resistors R1, R2, R3 and R4 corresponding to the added capacitances are connected to the transfer gate electrodes G1, G2, G3 and G4.

When the respective transfer gate electrodes G1, G2, G3 and G4 are constructed as shown in FIG. 7, the connected positions a and c between the Al conductors 14a, 14c and the resistance lines 13a, 13b are set to the inner sides of the input terminals $\phi 1$ and $\phi 3$ with respect to the first and third transfer gate electrodes G1, G3, whereby the values of the resistors R1, R3 are decreased. Further, the connected positions b and d between the Al conductors 14b, 14d and the resistance lines 13b, 13d are set to the conductor layers 12b, 12d with respect to the second and fourth transfer gate electrodes G2, G4, whereby the values of the resistors R2, R4 are increased.

According to the above-mentioned method, the resistors R1, R2, R3 and R4 corresponding to the added capacitances can be coupled to the respective transfer gate electrodes G1, G2, G3 and G4 with ease.

While the present invention is applied to the CCD image sensor as described above, the present invention is not limited thereto and may be applied to a CCD linear sensor, a CCD delay line or the like.

As set out above, according to the charge transfer device of the present invention, the transfer efficiency of signal charge can be increased without decreasing the maximum amount of electric charges handled in the charge transfer region.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A charge transfer device formed on a semiconductor substrate comprising:
    a channel region formed on said semiconductor substrate;
    at least a set of transfer gate electrodes of variable sizes formed adjacent to each other and insulated from each other, said set of transfer gate electrode formed over said channel region through an insulating film and each transfer gate electrode spaced a same distance from the channel region and partially overlapped adjacent transfer gate electrodes;
    clock means for providing said transfer gate electrodes with multiple clock pulses; and
    a plurality of resistors with one provided between each of said transfer gate electrodes and said clock means, said resistors having respective resistances values such that a time constant between each of said transfer gate electrodes and said clock means are substantially equal, thereby charge transfer efficiency of said charge transfer device is improved.

2. A charge transfer device according to claim 1, wherein the resistive value of said resistors is determined by a line and a conductor connected in parallel with a portion of said line.

3. A solid state image sensing device formed on a semiconductor substrate comprising:
   a plurality of photo-sensing elements formed in a surface of said semiconductor substrate;
   a channel region formed on said semiconductor substrate, said channel region formed adjacent to said plurality of photo-sensing elements;
   at least a set of transfer gate electrodes of variable sizes which are insulated from each other and formed over said channel region through an insulating film and each transfer gate electrode spaced a same distance from said channel region and partially overlapped adjacent transfer gate electrodes;
   clock means for providing said transfer gate electrodes with multiple clock pulses; and
   a plurality of resistors with one provided between each of said transfer gate electrodes and said clock means, said resistors having respective resistive values such that a time constant between each of said transfer gate electrodes and said clock means are substantially equal, thereby charge transfer efficiency of said charge transfer device is improved.

4. A solid state image sensing device according to claim 3, wherein the resistive value of said resistors is determined by a line and a conductor connected in parallel with a portion of said line.

5. A charge transfer device formed on a semiconductor substrate comprising:
   a channel region formed on the semiconductor substrate;
   a plurality of transfer gate electrodes of variable sizes formed over the channel region through an insulating layer, each transfer gate electrodes formed adjacent to each other and insulated from each other, each transfer gate electrode at least partially overlapping adjacent transfer gate electrodes and spacing a same distance from the channel region;
   clock means for providing the transfer gate electrodes with multiple clock pulses; and
   a plurality of resistors each of which is provided between each transfer gate electrode and the clock means, said resistors having respective resistances so that the products of the resistance of each of said resistors and the capacitance of each of said transfer gates are equal, thereby charge transfer efficiency of said charge transfer device is improved.

6. A solid stage image sensing device formed on a semiconductor substrate comprising:
   a plurality of photo-sensing elements formed in a surface of said semiconductor substrate;
   a channel region formed on said semiconductor substrate, said channel region formed adjacent to said plurality of photo-sensing elements;
   a plurality of transfer gate electrodes of variable sizes formed over the channel region through an insulating layer, each transfer gate electrodes formed adjacent to each other and insulated from each other, each transfer gate electrode at least partially overlapping adjacent transfer gate electrodes and spacing a same distance from the channel region;
   clock means for providing said transfer gate electrodes with multiple clock pulses; and
   a plurality of resistors provided between each of the transfer gate electrodes and the clock means, said resistors having respective resistances so that the products of the resistance of each of said resistors and the capacitance of each of said transfer gates are equal, thereby charge transfer efficiency of said charge transfer device is improved.

* * * * *